United States Patent
Allibert et al.

(10) Patent No.: US 9,620,626 B2
(45) Date of Patent: Apr. 11, 2017

(54) METHOD FOR FABRICATING A SEMICONDUCTOR DEVICE INCLUDING FIN RELAXATION, AND RELATED STRUCTURES

(71) Applicants: Soitec, Bernin (FR); STMicroelectronics, Inc., Coppell, TX (US)

(72) Inventors: Frédéric Allibert, Albany, NY (US); Pierre Morin, Albany, NY (US)

(73) Assignees: SOITEC, Bernin (FR); STMICROELECTRONICS, INC., Coppell, TX (US)

(*) Notice: Subject to any disclaimer, the term of this patent is extended or adjusted under 35 U.S.C. 154(b) by 0 days.

(21) Appl. No.: 14/272,660

(22) Filed: May 8, 2014

(65) Prior Publication Data

US 2015/0325686 A1    Nov. 12, 2015

(51) Int. Cl.
*H01L 29/66* (2006.01)
*H01L 21/02* (2006.01)
*H01L 29/205* (2006.01)
*H01L 21/8238* (2006.01)
*H01L 21/84* (2006.01)

(52) U.S. Cl.
CPC .. *H01L 29/66795* (2013.01); *H01L 21/02532* (2013.01); *H01L 21/02614* (2013.01); *H01L 21/02694* (2013.01); *H01L 21/823821* (2013.01); *H01L 21/845* (2013.01); *H01L 29/205* (2013.01)

(58) Field of Classification Search
None
See application file for complete search history.

(56) References Cited

U.S. PATENT DOCUMENTS

| 7,524,740 | B1 | 4/2009 | Liu et al. |
| 7,981,767 | B2 | 7/2011 | Guenard et al. |
| 8,169,025 | B2 | 5/2012 | Bedell et al. |
| 2002/0089032 | A1 | 7/2002 | Huang |
| 2004/0195656 | A1 | 10/2004 | Ghyselen et al. |
| 2011/0108920 | A1* | 5/2011 | Basker ............ H01L 21/845 257/351 |

(Continued)

FOREIGN PATENT DOCUMENTS

| EP | 2151852 A1 | 2/2010 |
| WO | 2011054776 A1 | 5/2011 |

OTHER PUBLICATIONS

Nakaharai et al., Formation Process of High-Purity Ge-On-Insulator Layers by Ge-Condensation Technique, J. Appl. Phys. vol. 105, (2009), pp. 024515-1-024515-8.

Feste et al., Performance Enhancement of Uniaxially-Tensile Strained Si NW-nFETs Fabricated by lateral Strain Relaxation of SSOI, Ultimate Integration of Silicon, 10th International Conference, (Mar. 18, 2009), pp. 109-112.

(Continued)

*Primary Examiner* — Matthew Reames
*Assistant Examiner* — Steven B Gauthier
(74) *Attorney, Agent, or Firm* — TraskBritt

(57) ABSTRACT

Methods of fabricating semiconductor structures involve the formation of fins for finFET transistors having different stress/strain states. Fins of one stress/strain state may be employed to form n-type finFETS, while fins of another stress/strain state may be employed to form p-type finFETs. The fins having different stress/strain states may be fabricated from a common layer of semiconductor material. Semiconductor structures and devices are fabricated using such methods.

21 Claims, 8 Drawing Sheets

(56) References Cited

U.S. PATENT DOCUMENTS

| | | |
|---|---|---|
| 2011/0175166 A1 | 7/2011 | Bedell et al. |
| 2013/0334610 A1 | 12/2013 | Moroz et al. |
| 2014/0151802 A1 | 6/2014 | Basker et al. |
| 2014/0264492 A1* | 9/2014 | Lee .................. H01L 29/66803 257/288 |

OTHER PUBLICATIONS

Flachowsky et al., Scalability of Advanced Partially Depleted n-MOSFET Devices on Biaxial Strained SOI Substrates, Ultimate Integration of Silicon, 10th International Conference, (Mar. 18, 2009), pp. 161-164.

International Search Report for International Application No. PCT/US2015/027974 mailed Jul. 31, 2015, 5 pages.

International Written Opinion for International Application No. PCT/US2015/027974 mailed Jul. 31, 2015, 10 pages.

Irisawa et al., High-Performance Uniaxially Strained SiGe-on-Insulator pMOSFETs Fabricated by Lateral-Strain Relaxation Technique, IEEE Transactions on Electron Devices, vol. 53, No. 11, (Nov. 2006), pp. 2809-2815.

Khakifirooz et al., Aggressively Scaled Strained Silicon Directly on Insulator (SSDOI) FinFETs, 2013 IEEE SOI-3D-Subthreshold Microelectronics Technology Unified Conference, (Oct. 7, 2013), pp. 1-2.

International Preliminary Report on Patentability for International Application No. PCT/US2015/027974 dated Nov. 8, 2016, 10 pages.

* cited by examiner

US 9,620,626 B2

METHOD FOR FABRICATING A SEMICONDUCTOR DEVICE INCLUDING FIN RELAXATION, AND RELATED STRUCTURES

TECHNICAL FIELD

Embodiments of the present disclosure relate to methods that may be used to fabricate n-type field effect transistors and p-type field effect transistors having different stress states in a common layer on a semiconductor substrate, and to semiconductor structures and devices fabricated using such methods.

BACKGROUND

Semiconductor devices such as microprocessors and memory devices employ solid state transistors as a basic, primary operational structure of the integrated circuits thereof. One type of transistor commonly employed in semiconductor structures and devices is the field effect transistor (FET), which generally includes a source contact, a drain contact, and one or more gate contacts. A semiconductive channel region extends between the source contact and the drain contact. One or more pn junctions are defined between the source contact and the gate contact. The gate contact is located adjacent at least a portion of the channel region, and the conductivity of the channel region is altered by the presence of an electrical field. Thus, an electrical field is provided within the channel region by applying a voltage to the gate contact. Thus, for example, electrical current may flow through the transistor from the source contact to the drain contact through the channel region when a voltage is applied to the gate contact, but may not flow through the transistor from the source contact to the drain contact in the absence of an applied voltage to the gate contact.

Recently, field-effect transistors (FETs) have been developed that employ discrete, elongated channel structures referred to as "fins." Such a transistor is often referred to in the art as a "finFET." Many different configurations of finFETs have been proposed in the art.

The elongated channel structures or fins of a finFET comprise a semiconductor material that may be doped either n-type or p-type. It has also been demonstrated that the conductivity of n-type doped semiconductor materials may be improved when the n-type semiconductor material is in a state of tensile stress, and the conductivity of p-type semiconductor materials may be improved when the p-type semiconductor material is in a state of compressive stress.

U.S. Pat. No. 8,169,025, which issued May 1, 2012 to Bedell et al., discloses a semiconductor device and fabrication method that include a strained semiconductor layer having a strain in one axis. A long fin and a short fin are formed in the semiconductor layer such that the long fin has a strained length along the one axis. An n-type transistor is formed on the long fin, and a p-type transistor is formed on the at least one short fin.

DISCLOSURE

In some embodiments, the present disclosure includes methods of fabricating semiconductor devices. In accordance with disclosed embodiments, one or more first fins may be formed in a layer of strained semiconductor material. The layer of strained semiconductor material may be disposed over an insulating layer on a base substrate. The one or more first fins may have lengths below a critical length Lc. After forming the one or more first fins, a heat treatment may be conducted causing relaxation of stress within the one or more first fins. One or more second fins may also be formed in the layer of strained semiconductor material. In accordance with some embodiments, the one or more second fins may have a length above the critical length Lc. In accordance with further embodiments, the one or more second fins may be formed after conducting the heat treatment.

BRIEF DESCRIPTION OF THE FIGURES

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

DETAILED DESCRIPTION

Embodiments of the present disclosure are described below with reference to the attached figures. The illustrations presented herein are not meant to be actual views of any particular semiconductor structure or device, but are merely idealized representations that are used to describe embodiments of the disclosure. The figures are not drawn to scale.

The terms "first" and "second" in the description and the claims are used for distinguishing between similar elements.

As used herein, the term "fin" means an elongated, three-dimensional finite and bounded volume of semiconductor material having a length, a width, and a height, wherein the length is greater than the width. The width and height of the fin may vary along the length of the fin in some embodiments.

Described below with reference to the figures are methods that may be used to fabricate semiconductor devices. As discussed in further detail below, the methods generally involve the formation of at least one first fin in a layer of strained semiconductor material overlying an insulating layer on a base substrate. After forming the at least one first fin, a heat treatment may be conducted to cause relaxation of stress within the at least one first fin. At least one second fin may also be formed in the layer of strained semiconductor material. The at least one second fin may have a longer length than the first fin structure such that the at least one second fin does not relax during the heat treatment used to relax the at least one first fin, or the at least one second fin may be formed after conducting the heat treatment to avoid relaxing the at least one second fin.

Figure 1:
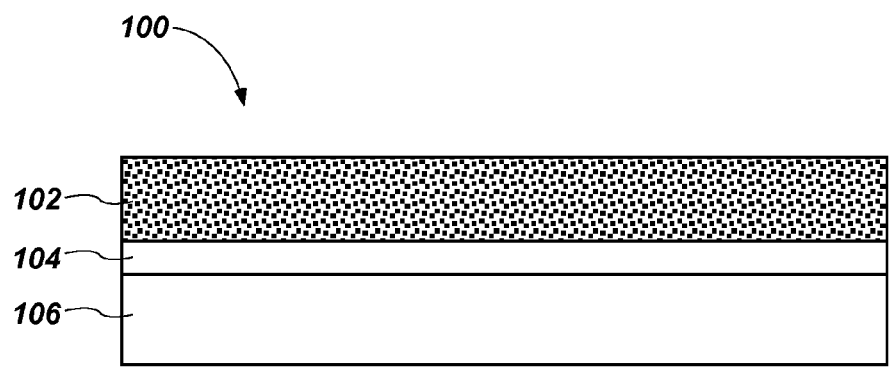
FIG. 1 is a schematically illustrated cross-sectional side view of a multilayer substrate that includes a layer of strained semiconductor material over an insulating layer on a base substrate.

FIG. 1 illustrates an example of a multilayer substrate 100 that may be employed in embodiments of the present disclosure. As shown in FIG. 1, the multilayer substrate 100 may include a layer of strained semiconductor material 102 overlying an insulating layer 104 on a base substrate 106.

The base substrate 106 may comprise a die or wafer of, for example, semiconductor material (e.g., silicon, germanium, a III-V semiconductor material, etc.), a ceramic material (e.g., silicon oxide, aluminum oxide, silicon carbide, etc.), or a metal material (e.g., molybdenum, etc.). The base substrate 106 may have a monocrystalline or polycrystalline microstructure in some embodiments. In other embodiments, the base substrate 106 may be amorphous. The base substrate 106 may have a thickness ranging from about 400 µm to about 900 µm (e.g., about 750 µm).

The insulating layer 104 may comprise what is often referred to in the art as a "Buried OXide layer" or "BOX." The insulating layer 104 may comprise, for example, an oxide, a nitride, or an oxynitride. The insulating layer 104 may be crystalline or amorphous. In some embodiments, the insulating layer 104 may comprise a glass, such as a borophosphosilicate glass (BPSG). The insulating layer 104 may have an average layer thickness of, for example, between about 10 nm and about 50 nm, although thicker or thinner insulating layers 104 may also be employed in embodiments of the present disclosure.

The layer of strained semiconductor material 102 may comprise, for example, a layer of strained silicon, strained germanium, or a strained III-V semiconductor material. Thus, the semiconductor material 102 may have a crystal structure exhibiting lattice parameters that are either above (tensile strained) or below (compressively strained) the relaxed lattice parameters that would normally be exhibited by the crystal structure of the respective semiconductor material 102, if the semiconductor material 102 existed in free-standing, bulk form. The layer of strained semiconductor material 102 may have an average layer thickness of about 50 nm or less, or even about 35 nm or less, although thicker layers of strained semiconductor material 102 may also be employed in embodiments of the present disclosure.

Although many methods are known in the art for providing a strained layer of semiconductor material 102 on a multilayer substrate 100 such as that shown in FIG. 1 and may be employed in embodiments of the present disclosure, the strained layer of semiconductor material 102 may be provided on the multilayer substrate 100 using what is referred to in the art as a SMART CUT® process. In such processes, the layer of semiconductor material 102 is bonded over the base substrate 106 with the insulating layer 104 therebetween at elevated temperatures. The stress and strain within the layer of semiconductor material 102 may be tensile or compressive in nature. Counteracting stress and strain may also be generated within the insulating layer 104 and/or the base substrate 106, although the magnitude of the counteracting stress and strain within the insulating layer 104 and/or the base substrate 106 may be significantly lower than the magnitude of the stress and strain within the semiconductor material 102 due to the fact that the combined thickness of the insulating layer 104 and/or the base substrate 106 is significantly larger than the thickness of the layer of strained semiconductor material 102. As a non-limiting example, when the stress level in the layer of semiconductor material 102 is about 1.0 GPa, the stress in the insulating layer 104 and/or the base substrate 106 may be on the order of about 0.1 MPa.

Figure 2:
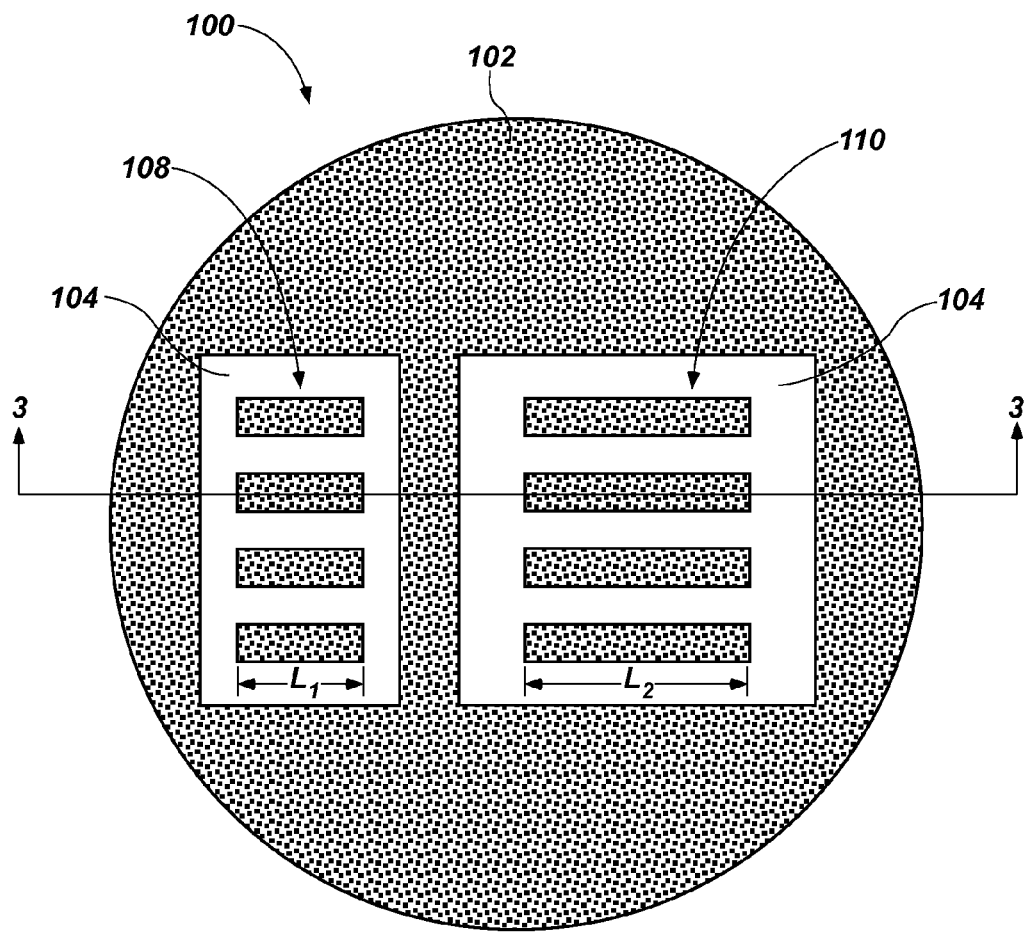
FIG. 2 is a schematically illustrated top plan view of a portion of the multilayer substrate of FIG. 1 after a plurality of first fin structures and a plurality of second fin structures have been defined in the layer of strained semiconductor material.

As shown in FIG. 2, one or more first fins 108 may be formed in the layer of strained semiconductor material 102. The first fins 108 may be formed in the layer of semiconductor material 102 using a masking and etching process, such as those commonly employed in the industry. The first fins 108 may comprise fins that are intended to be fins of one of n-type finFET transistors and p-type finFET transistors, although each of the first fins 108 may be intended be of the same type (i.e., either n-type or p-type).

The first fins 108 may have a length $L_1$ that is below a critical length $L_C$. As discussed in further detail below, the critical length Lc is the length at which the semiconductor material 102 in the fins 108 will relax during a subsequent heat treatment process. In other words, a subsequent heat treatment may be carried out under conditions at which the stress and strain within the crystal lattice of the semiconductor material 102 generally will not relax. However, the stress and strain may be relaxed during the subsequent heat treatment process in the semiconductor material 102 within the discrete volumes thereof in the first fins 108, which have lengths $L_1$ below the critical length $L_C$.

As shown in FIG. 2, optionally, one or more second fins 110 may also be formed in the layer of semiconductor material 102. The one or more second fins 110 may be formed in the layer of semiconductor material 102 using a masking and etching process. In some embodiments, the first fins 108 and the second fins 110 may be formed together in a common masking and etching process. The second fins 110 may comprise fins that are intended to be fins of one of n-type finFET transistors and p-type finFET transistors, although each of the second fins 110 may be intended be of the same type (i.e., either n-type or p-type). The second fins 110 also may be intended to be of the opposite type relative to the first fins 108. In other words, if the first fins 108 are to be n-type fins, the second fins 110 may be p-type fins. If the first fins 108 are to be p-type fins, the second fins 110 may be n-type fins.

The second fins 110 may have a length $L_2$ that is above the critical length $L_C$ at which the semiconductor material 102 in the fins 108, 110 will relax during the subsequent heat treatment process. Thus, in a subsequent heat treatment carried out under conditions (e.g., time, temperature, and pressure) at which the stress and strain within the crystal lattice of the first fins 108 will relax, the stress and strain within the crystal lattice of the second fins 110 will not entirely relax, although there may be at least some measurable relaxation in regions within the second fins 110.

Figure 3:
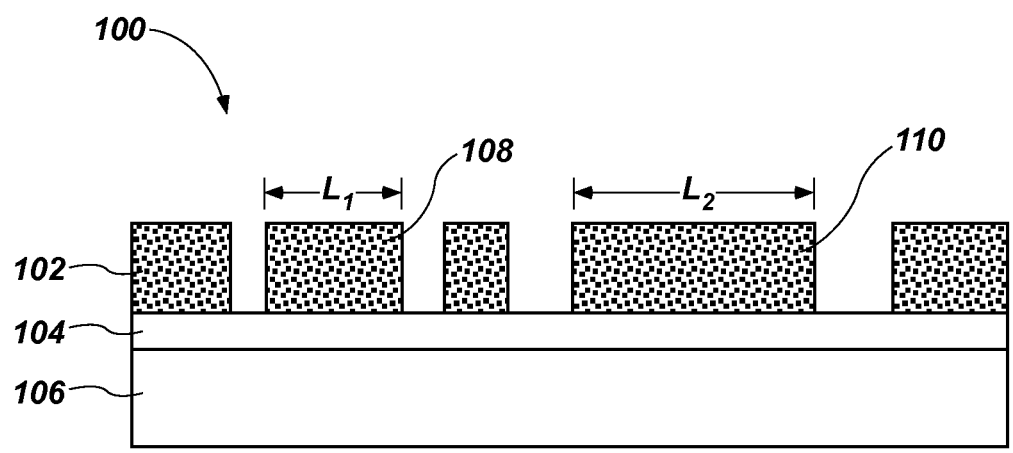
FIG. 3 is a schematically illustrated cross-sectional side view of a portion of the substrate of FIG. 2 and illustrates two fin structures thereof having different lengths.

FIG. 3 is a cross-sectional view of a portion of the multilayer substrate 100 taken along section line 3-3 of FIG. 2, and illustrates the length $L_1$ of one first fin 108 and the length $L_2$ of one second fin 110. The first and second fins 108, 110 may have heights and widths that are much smaller compared to the lengths $L_1$, $L_2$ of the first and second fins 108, 110. As non-limiting examples, the fins 108, 110 may have widths and heights less than about 0.1 µm, less than about 0.065 µm, or even less than about 0.045 µm. For example, the heights and widths of the first and second fins 108, 110 may be between about 30 nm and about 10 nm, respectively. The second fins 110, however, may not entirely relax in the longitudinal direction parallel to the length $L_2$ during the heat treatment, while the first fins 108 do at least substantially entirely relax in the longitudinal direction parallel to the length $L_1$ during the same heat treatment.

As a non-limiting example, the layer of strained semiconductor material 102 may comprise a layer of tensile strained silicon, and the insulating layer 104 may comprise a layer of silicon oxide. Tensile strained silicon on an insulating layer 104 of silicon oxide may exhibit a stress of, for example, between about 1 GPa and about 3 GPa. In such embodiments, the critical length $L_C$ may be about 1.0 µm, for example. In such an instance, as an example, the lengths $L_1$ of the first fins 108 may be below about 1 µm, below about 0.5 µm, or even below about 0.3 µm, and the lengths $L_2$ of the second fins 110 may be above about 1.0 µm, above about 1.5 µm, or even about 2.0 µm.

Figure 4:
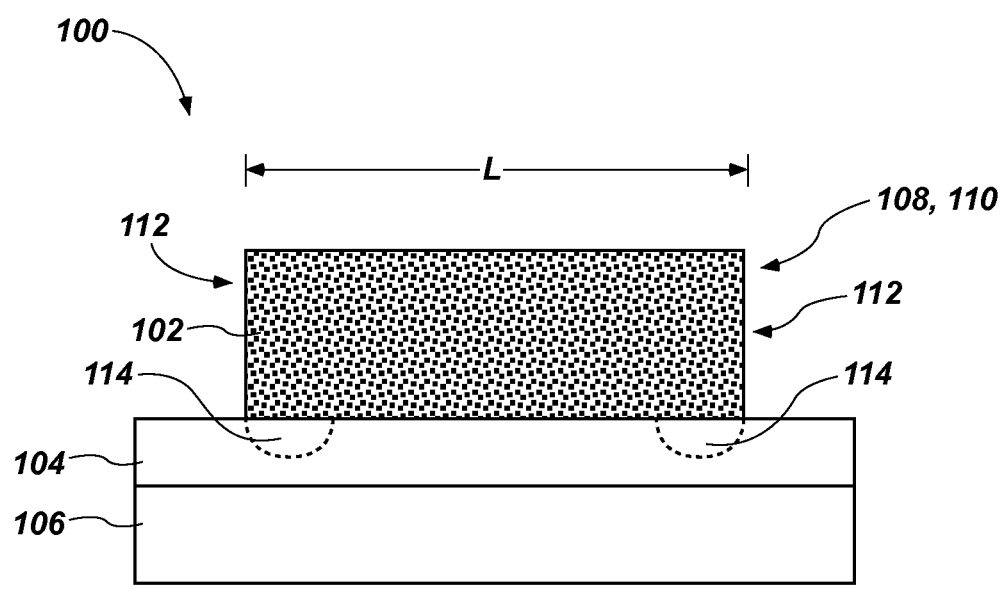
FIGS. 4 and 5 are similar to FIG. 3, but illustrate the relaxation of a fin structure upon subjecting the multilayer substrate to a thermal treatment process.

As shown in FIG. 4, when a fin 108, 110 of a predefined length L is cut in the layer of strained semiconductor material 102, a concentration of strain is observed in portions 114 (the regions within the dashed lines) of the insulting layer 104 located underneath the opposing longitudinal ends of the fin 108, 110 of predefined length L. This strain concentration may be sufficient to induce a local deformation (e.g., viscous flow, creep) of the insulating layer 104 by conducting a heat treatment under moderately elevated temperatures, which may cause the fin 108, 110 to relax in the longitudinal direction parallel to the length L. For example, when the stress within the strained semiconductor material 102 within fins 108, 110 having lengths L of about 0.5 µm is about 1 GPa, the magnitude of the stress induced in the portions 114 of the insulating layer 104 underlying the longitudinal ends of the fins 108, 110 may be above about 100 MPa. Such increased magnitudes of stress within the portions 114 of the insulating layer 104 may be sufficient to induce viscous flow, creep or other forms of localized deformation in the insulating layer 104 during the thermal treatment process, which may allow the overlying portions of the fins 108, 110 to relax.

Figure 5:
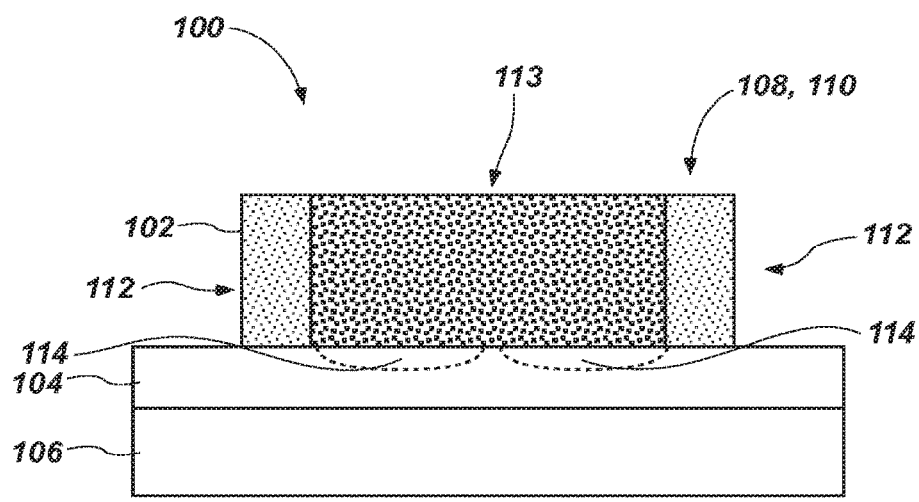

For example, FIG. 5 illustrates the fin 108, 110 of FIG. 4 at an intermediate stage during a heat treatment. As shown in FIG. 5, the longitudinal ends 112 of the fin 108, 110 have relaxed (as indicated by the less dense stippling), while a longitudinal mid-portion 113 of the fin 108, 110 remains in a strained state. The portions 114 of the insulating layer 104 in which strain is concentrated under the relaxing fin 108, 110 have migrated inwardly toward the center of the fin 108, 110 underneath the mid-portion 113 of the fin 108, 110, which remains in strained state.

The applicants have observed that the processing parameters of the heat treatment for at least substantially entirely and homogeneously relaxing a fin 108, 110 depend on the fin length L. The longer the length of the fin 108, 110, the higher is the thermal budget required to fully relax the fin 108, 110 during a heat treatment. As a consequence, the applicants have achieved at least substantially entirely and homogeneously relaxed fins having longer lengths relative to known prior art.

The thermal treatment duration needed to relax a stressed domain can be evaluated by roughly $\Delta t \sim 5 \cdot \eta \cdot \Delta\sigma/(\sigma \cdot Y)$, where $\eta$ is the viscosity, $\sigma$ the initial stress, $\Delta\sigma$ the stress loss and Y Young's modulus (~100 GPa). Since the goal is a complete relaxation, $\Delta\sigma = \sigma$ and the relaxation time is then $\Delta t \cdot 5 \cdot \eta/Y$, The table below describes the typical time to relax a 50 nm domain, and a 1 µm long Fin, for different T° for a dense $SiO_2$.

| T (° C.) | η (Pa · s) | Δt (s) for a 50 nm domain | Time to relax a 1 µm long Fin |
|---|---|---|---|
| 800 | $10^{15}$ | 50000 | 6 days |
| 900 | $3 \cdot 10^{14}$ | 15000 | 42 hours |
| 1000 | $3 \cdot 10^{13}$ | 1500 | 4 hours |
| 1100 | $6 \cdot 10^{12}$ | 300 | 50 min |
| 1200 | $6 \cdot 10^{11}$ | 30 | 5 min |

From this table it appears clearly that relaxing a 1 µm Fin at a T° below 1000° C. requires processing times that are not well suited to industrial manufacturing.

Using techniques that reduce the BOX viscosity enables reducing the annealing T° by 100° C. for each decade of reduction in η, while maintaining a similar processing time.

In addition, it is possible to tailor the parameters of the heat treatment process so as to at least substantially completely and homogeneously relax relatively shorter first fins 108 having lengths $L_1$ below the critical length $L_C$, without entirely relaxing relatively longer second fins 110 having lengths $L_2$ above the critical length $L_C$. Thus, tensile or compressive stress and strain may be attained in at least a significant portion of the second fins 110 throughout the heat treatment. As a result, the first fins 108 may have a first lattice constant after conducting the heat treatment, and the second fins 110 may have a lattice constant that is different from the first lattice constant of the first fins 108 after the heat treatment.

Various techniques are known in the art for tailoring the insulating layer 104 to facilitate the relaxation of the overlying first fins 108 during the thermal treatment process.

For example, in some embodiments, the insulating layer 104 may not be completely dense, and may undergo densification during the thermal treatment process. Prior to the thermal treatment process, the insulating layer 104 may have a density lower than a density that may be achieved by thermally annealing the insulating layer 104 at a temperature above 750° C. The non-densified material may have a substantially lower viscosity and the ability of the insulating layer 104 to undergo densification during the thermal annealing process in regions of concentrated stress therein may facilitate the relaxation of the overlying first fins 108 during the thermal treatment process.

In some embodiments, atomic species may be implanted in the insulating layer 104 prior to the thermal treatment process, and the composition and concentration of the implanted atomic species may be selected to reduce a glass transition temperature and/or reduce a viscosity of the insulating layer 104 to facilitate localized redistribution of the insulating layer 104 and relaxation of overlying first fins 108 during the thermal treatment process. As a non-limiting example, atomic species implanted in the insulating layer 104 prior to the thermal treatment process may include one or both of boron and phosphorous. Hence, the viscosity of the insulating layer 104 with the implanted elements therein at the temperature of the thermal treatment process may be reduced relative to the viscosity of the insulating layer 104 in the absence of the implanted atomic species. As a consequence, relaxation of the first fins 108 during the heat treatment process may be achieved at relatively lower temperatures using such insulating layers 104 with implanted atomic species.

By enhancing the ability of the insulating layer 104 to undergo localized deformation during the heat treatment process, the heat treatment temperature for relaxing longitudinal stress in the fins 108 may be reduced, and/or relatively longer fins 108 may be at least substantially entirely relaxed for a given thermal treatment temperature.

Figure 6:
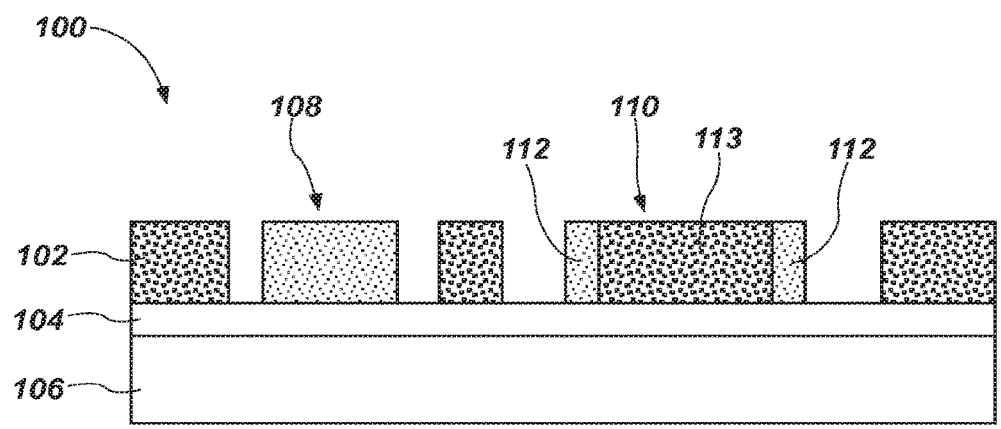
FIG. 6 is similar to FIG. 3, but illustrates one fin in a strained state and one fin in a relaxed state.

Referring to FIG. 6, the heat treatment process may be carried out at temperatures, pressures, and for a time selected such that the first fins 108 will at least substantially completely relax, while at least a longitudinal portion (e.g., a mid-portion 113) of each of the second fins 110 remains in a strained state. The un-patterned regions of the layer of strained semiconductor material 102 may also remain in the strained state throughout the heat treatment process.

As a non-limiting example, in embodiments in which the layer of strained semiconductor material 102 comprises a layer of tensile strained silicon, and the insulating layer 104 comprises a layer of silicon oxide, the heat treatment may be conducted at a temperature between about 950° C. and about 1250° C. in an inert atmosphere for a time of between about ten hours (10 hours) and about one minute (1 min). As non-limiting specific examples, the heat treatment process may be conducted at about 1050° C. in an inert atmosphere for about one hour (1 hour), or at about 1150° C. in an inert atmosphere for about five minutes (5 minutes). Stress and strain within the second fins 110 may be maintainable when the heat treatment is carried out at a temperature up to about 1250° C. The stress and strain within the first fins 108 may be relaxed when the heat treatment is carried out at temperatures between about 950° C. and about 1250° C., which temperatures are compatible with complementary metal oxide semiconductor (CMOS) processing.

It may be possible to relax first fins 108 having lengths below about 0.5 μm at heat treatment temperatures as low as about 600° C. When the heat treatment is conducted at such low temperatures, the stress and strain within at least portions of the second fins 110 may be maintained as long as the lengths $L_2$ of the second fins 110 are about 1 μm or more.

Considering a 25 nm thick insulating layer 104 of silicon oxide, and a 35 nm thick layer of strained semiconductor material 102 comprising tensile strained silicon (Si), heat treatment processing conditions as a function of the length $L_1$ of the first fins 108 may be as set forth in table 1 below:

TABLE 1

| First Fin length (μm) | Heat treatment temperature (° C.) | Processing duration (min) |
| --- | --- | --- |
| 1 | 1100 | 1 hour |
| 0.5 | 1100 | 30 min |
| 0.3 | 1100 | 15 min |

As previously mentioned, the strained layer of semiconductor material 102 also may comprise a compressively strained semiconductor layer, such as a compressively strained silicon germanium (SiGe) layer. Compressively strained SiGe on an insulator layer 104 may exhibit a stress of from about 0 GPa to about −4 GPa.

Considering a 25 nm thick insulator layer 104 comprising silicon oxide, and a 30 nm thick compressively strained $Si_{0.25}Ge_{0.75}$ layer, heat treatment processing conditions as a function of the length $L_1$ may be as set forth in table 2 below:

TABLE 2

| First Fin length (μm) | Heat treatment temperature (° C.) | Processing duration (min) |
| --- | --- | --- |
| 1 | 1100 | 1 hour |
| 0.5 | 1100 | 30 min |
| 0.3 | 1100 | 15 min |

As shown in Tables 1 and 2 above, full longitudinal stress relaxation of the first fins 108 may be attained at lower temperatures for fins 108 having shorter lengths $L_1$.

After the anneal, the strain within the insulating layer 104 underneath the first fins 108 also may be at least substantially reduced or eliminated, although strain may remain in the insulating layer 104 underneath at least a portion of each of the second fins 110.

If the layer of semiconductor material 102 is a tensile strained layer, the first fins 108 may have a smaller lattice constant than the second fins 110 after the heat treatment. In such embodiments, the first fins 108 may be used to form p-type finFETS, and the second fins 110 may be used to form n-type finFETS, for example. If the layer of semiconductor material 102 is a compressively strained layer, the first fins 108 may have a larger lattice constant than the second fins 110 after the heat treatment. In such embodiments, the first fins 108 may be used to form n-type finFETs, and the second fins 110 may be used to form p-type finFETs, for example.

It may be desirable to form n-type finFETs having fins that are in a state of tensile stress, and to form p-type finFETs having fins that are in a relaxed state or in a state of compressive stress. Thus, in some embodiments, whichever of the first fins 108 and the second fins 110 has the highest lattice constant may be selected and used to foal' the fins of n-type finFETs, and whichever of the first fins 108 and the second fins 110 has the lowest lattice constant may be selected and used to form the fins of p-type finFETs.

In embodiments in which the layer of strained semiconductor material 102 comprises a tensile strained semiconductor layer, the crystal lattice of the first fins 108 may undergo relaxation characterized by a decrease of the lattice constant of the semiconductor material 102 within first fins 108. Therefore, the lattice constant within the first fins 108 will be lower than the lattice constant within the second fins 110. In such embodiments, p-type finFETs may be formed using the first fins 108, and n-type finFETs may be formed using the second fins 110. The performance of n-type finFETs may be improved by the presence of tensile strain within the second fins 110 thereof, and no degradation of the performance of the p-type finFETs fabricated using the first fins 108 may be observed. Additionally, since the relaxation of each of the first fins 108 may be at least substantially homogeneous across the entire length of the first fin 108, the mobility of electron holes within the p-type finFETs formed using the first fins 108 may not be reduced relative to the known prior art, and almost no threshold voltage (Vt) variation may be observed.

On the contrary, in embodiments in which the layer of strained semiconductor material 102 comprises a compressively strained semiconductor layer, the crystal lattice of the first fins 108 may undergo relaxation characterized by an increase of the lattice constant of the semiconductor material 102 within first fins 108. Therefore, the lattice constant of the first fins 108 is higher than the lattice constant of the second fins 110 after the heat treatment, and the p-type finFETs may be formed using the second fins 110, while the n-type finFETS may be formed using the first fins 108. The performance of p-type finFETs may be improved by the presence of compressive strain within the second fins 110 thereof, while no degradation of the performance of n-type finFETs formed using the first fins 108 may be observed. Additionally, since the relaxation of the first fins 108 may be at least substantially homogeneous across the lengths of the first fins 108, the mobility of electrons within the n-type finFETs formed using the first fins 108 may not be degraded compared to the known prior art, and threshold voltage (Vt) variation may not be observed.

As previously mentioned, in some embodiments, the layer of strained semiconductor material 102 may comprise a tensile strained semiconductor layer, such as a tensile strained silicon (Si) layer. Such a tensile strained silicon layer may exhibit tensile stress therein above about 1.3 GPa. The electron mobility within an n-type finFET formed using a tensile strained silicon fin having a tensile stress of about 1.3 GPa therein may be about 60% higher than the electron mobility within an n-type finFET formed using a relaxed silicon fin.

In some embodiments of the present disclosure, after conducting the heat treatment process and relaxing the first fins 108, a stress or strain may again be generated within the first fins 108. The stress or strain generated within the first fins 108 after the heat treatment process may be opposite in nature to the stress and strain remaining within the second fins 110 after the heat treatment process. For example, if the second fins 110 are in a state of tensile stress and strain after the heat treatment, compressive stress and strain may be induced within the first fins 108 (while maintaining the tensile stress and strain within the second fins 110). As another example, if the second fins 110 are in a state of compressive stress and strain after the heat treatment, tensile stress and strain may be induced within the first fins 108 (while maintaining the compressive stress and strain within the second fins 110).

As a specific non-limiting example, in embodiments in which the layer of strained semiconductor material 102 comprises a tensile strained silicon layer, the relaxed silicon in the first fins 108 after the heat treatment process may be converted to compressively strained silicon germanium (SiGe) using processes known in the art, such as an oxidation condensation process or a thermal mixing process, as described below with reference to FIGS. 7 through 10. For example, the oxidation condensation process disclosed in S. Nakaharai et al., *J. Appl. Phys.* 105:024515 (2009), which is hereby incorporated herein in its entirety by this reference, may be used to convert tensile strained silicon in the first fins 108 to compressively strained silicon germanium (SiGe).

Figure 7:
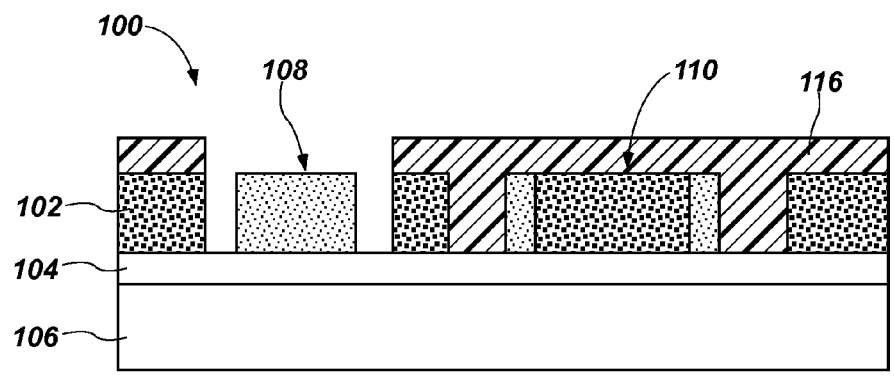
FIGS. 7 through 10 are simplified cross-sectional side views similar to that of FIG. 6 and illustrate the inducement of a stress and strain into the relaxed fin shown in FIG. 6.

As shown in FIG. 7, either the first fins 108 or the second fins 110 may be masked with a mask material 116, and the other of the first fins 108 and the second fins 110 may be exposed through the mask material 116. In the embodiment shown in FIGS. 7 through 10, the second fins 110 have been masked with the mask material 116 while the first fins 108 remain exposed through the mask material 116. The mask material 116 also may cover other portions of the layer of strained semiconductor material 102. The mask material 116 may comprise, for example, a layer of silicon dioxide, a layer of silicon nitride, or a layer of silicon oxynitride, and may be deposited over the multilayer substrate 100 using a deposition process. Conventional photolithography processes then may be performed to selectively etch through selected portions of the mask material 116 to form openings therein. In some embodiments, the mask material 116 may be deposited over the layer of strained semiconductor material 102 prior to forming the fins 108, 110, and a single etching process may be used to etch through the mask material 116 and the layer of semiconductor material 102 to pattern the mask material 116 and form the first fins 108 at the same time. Etching of the mask material 116 and the layer of strained semiconductor material 102 may be carried out, for example, by plasma etching.

As previously discussed, the first fins 108 may comprise relaxed silicon (Si) subsequent to the heat treatment process, while the second fins 110 comprise tensile strained silicon (Si) after the heat treatment process.

Figure 8:
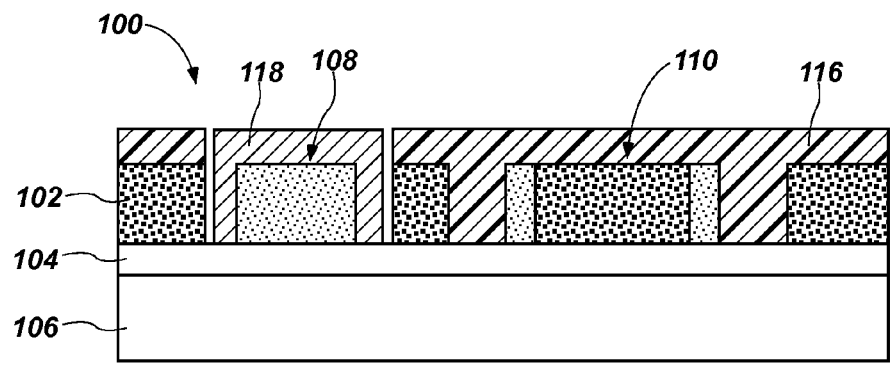

As shown in FIG. 8, an epitaxial layer of silicon germanium alloy 118 may be epitaxially deposited over either the fins 108, 110 that are exposed through the mask material 116. In the embodiment shown in FIGS. 7 through 10, the epitaxial silicon germanium alloy is shown deposited over the first fins 108. The mask material 116 prevents deposition of the silicon germanium alloy 118 on the second fins 110.

Figure 9:
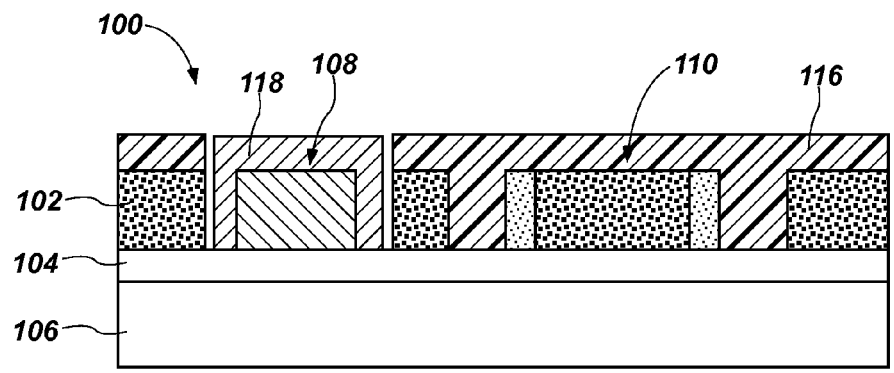
Figure 10:
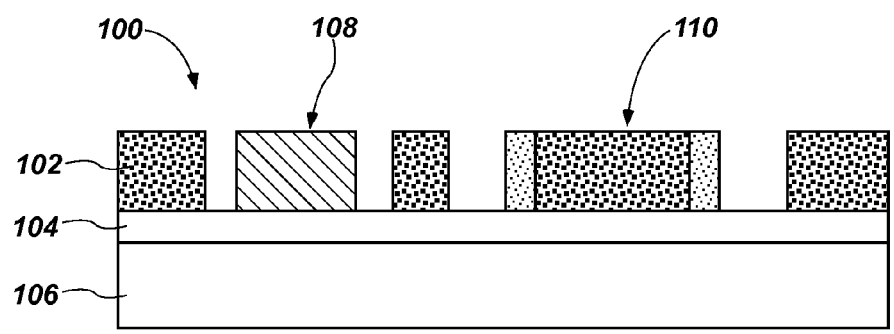

After depositing the silicon germanium alloy 118 on the first fins 108, an oxidation condensation process or a thermal mixing process may be carried out to introduce germanium atoms in the first fins 108 and convert the relaxed silicon of the first fins 108, which is represented by stippling in FIG. 8, to a strained SiGe alloy, which is represented by cross-hatching in FIG. 9. After the oxidation condensation process or a thermal mixing process, a layer of silicon oxide may be present at the surface of the first fins 108, and any such layer of silicon oxide and the mask material 116 may be removed to form the structure shown in FIG. 10, which includes compressively strained SiGe first fins 108 and tensile strained silicon (Si) second fins 110.

Thus, as described above with reference to FIGS. 7 through 10, while the second fins 110 are under tensile stress and strain, a compressive stress and strain may be induced in the first fins 108 after conducting the heat treatment process to relax the first fins 108. The presence of the compressive strain in the first fins 108 may enhance the performance of p-type finFETs, which may be formed using the first fins 108.

As previously mentioned, in some embodiments, the layer of strained semiconductor material 102 may comprise a compressively strained semiconductor layer, such as a compressively strained silicon germanium ($Si_{0.75}Ge_{0.25}$) layer. Such a compressive strained silicon layer may exhibit compressive stress therein above about −1.6 GPa. The hole mobility within a p-type finFET formed using a compressively strained SiGe fin having a compressive stress of about −1.6 GPa therein may be about 100% higher than the hole mobility within a p-type finFET formed using a relaxed SiGe fin. The mobility increase is about 60% fully strained for $Si_{0.8}Ge_{0.2}$ (See Khakifirooz, EDL 2013).

In some embodiments of the disclosure, the size and/or shape of the first fins 108 and the second fins 110 may be altered after the thermal treatment process, but in such a manner as to preserve the respective stresses and strains therein. For example, the length $L_2$ of the second fins 110 optionally may be reduced subsequent to the using a masking and etching process. For example, the length $L_2$ of the second fins 110 may be reduced to a level substantially similar to the length $L_1$ of the first fins 108 subsequent to the thermal treatment process.

In the embodiments discussed above, the one or more second fins 110 are at least initially formed such that they have a length $L_2$ above the critical length Lc during the thermal treatment process so that the heat treatment will not eliminate the longitudinal stress within the second fins 110. In such embodiments, the second fins 110 may be formed before or after conducting the heat treatment. Thus, the second fins 110 may advantageously be formed simultaneously together with the first fins 108.

In additional embodiments, the one or more second fins 110 may be formed initially with a length $L_2$ that is less than the critical length Lc, but after first forming the first fins 108 and conducting the heat treatment process, such that the second fins 110 are not exposed to the heat treatment process. Such methods are illustrated in FIGS. 11 through 17. In such embodiments, the longitudinal stress and strain of the second fins 110 is maintained since the second fins 110 are not formed until after conducting the heat treatment to relax the first fins 108.

Figure 11:
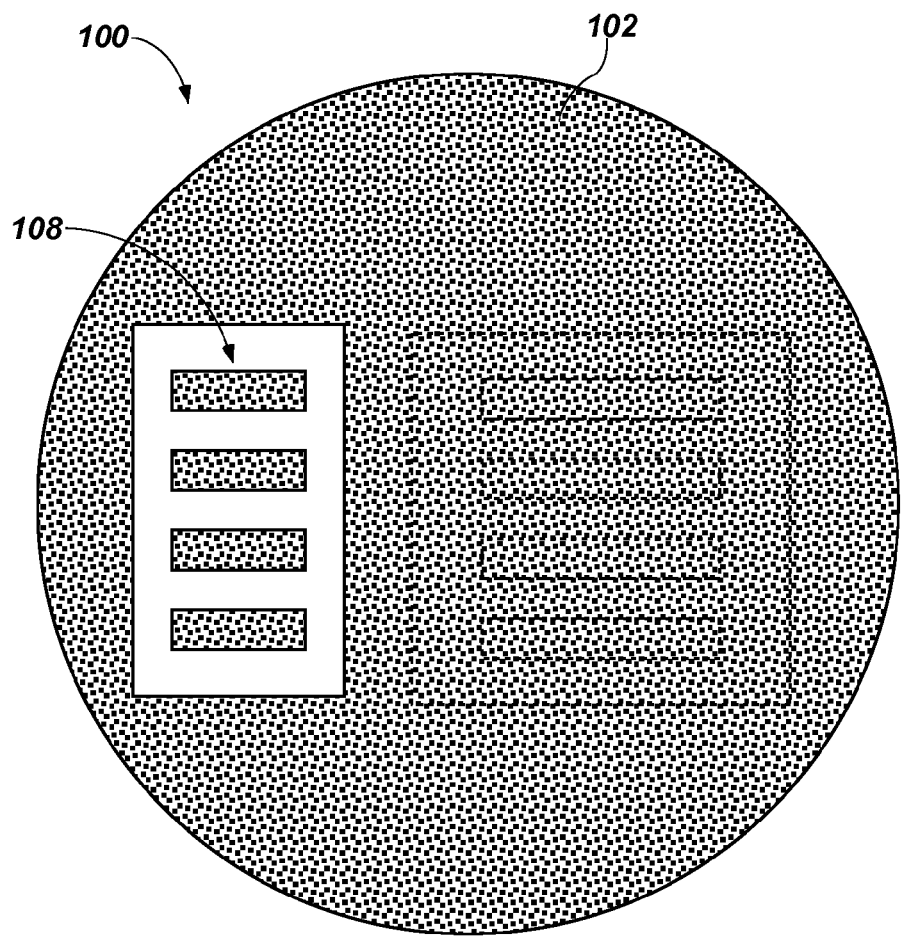
FIG. 11 is a schematically illustrated top plan view of a portion of another multilayer substrate like that of FIG. 1 after a plurality of first fin structures have been defined in the layer of strained semiconductor material.
Figure 12:
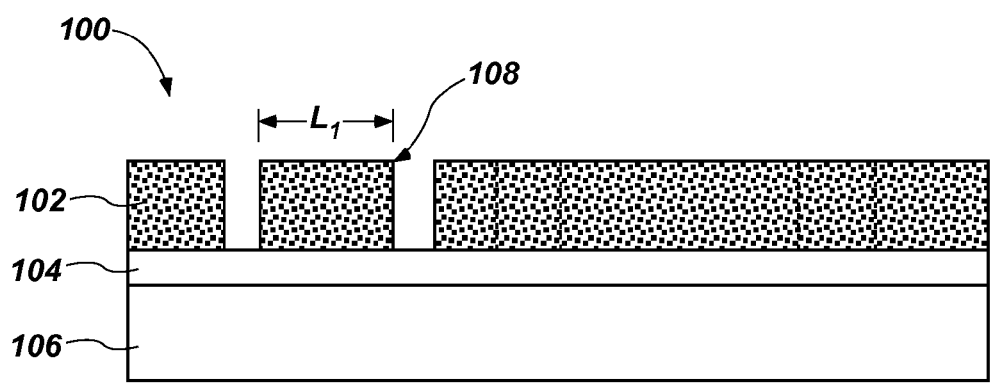
FIG. 12 is a schematically illustrated cross-sectional side view of a portion of the substrate of FIG. 11 and illustrates one fin structure thereof.

As shown in FIGS. 11 and 12, first fins 108 may be defined in the layer of strained semiconductor material 102 using, for example, a masking and etching process as previously described herein. The first fins 108 may have a length $L_1$ that is less than a critical length $L_C$, as also previously discussed.

Figure 13:
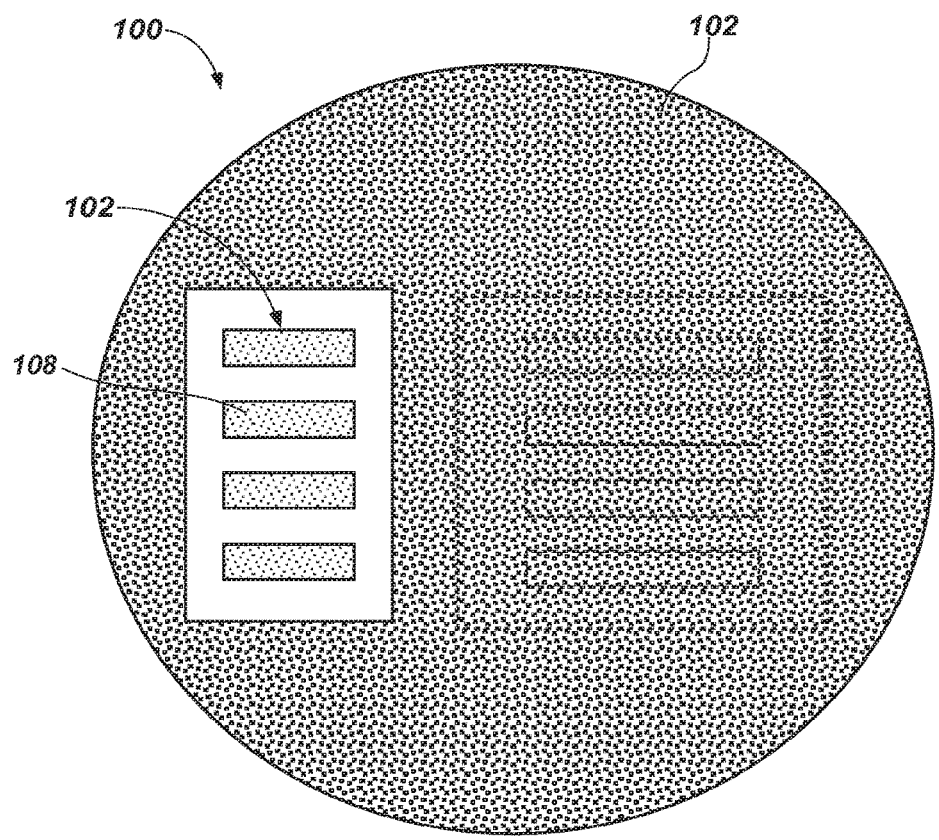
FIG. 13 is a top plan view like that of FIG. 11 illustrating the structure after performing a thermal treatment process on the structure of FIGS. 11 and 12 to relax the fins thereof.
Figure 14:
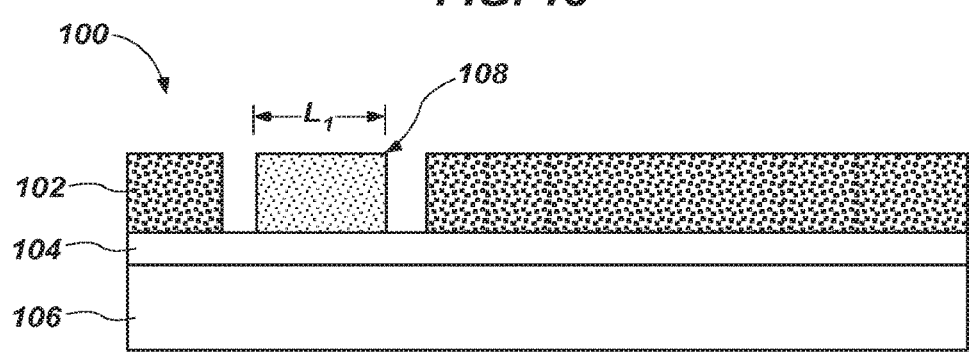
FIG. 14 is a schematically illustrated cross-sectional side view of a portion of the substrate of FIG. 13 and illustrates a relaxed fin structure thereof.

Referring to FIGS. 13 and 14, after forming the first fins 108 and prior to forming any second fins 110, the heat treatment process may be conducted as previously described herein so as to at least substantially relax the strained semiconductor material 102 within the first fins 108 (as represented by stippling of lower density) and without relaxing the remainder of the layer of strained semiconductor material 102.

Figure 15:
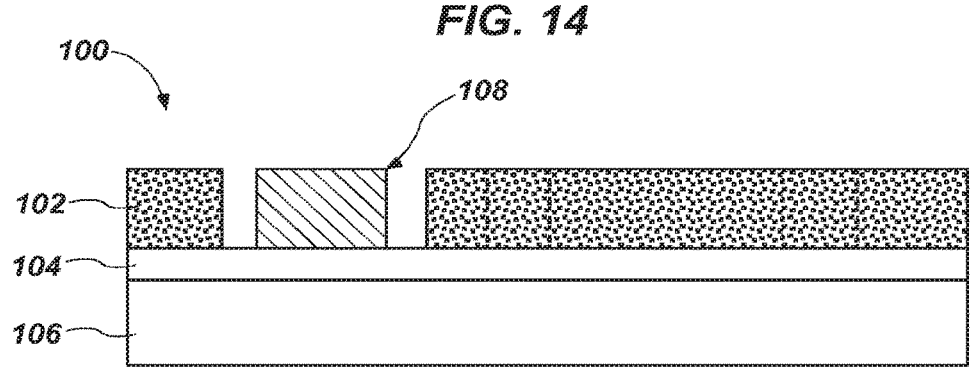
FIG. 15 is similar to FIG. 14, and illustrates the fin after inducing a stress and strain into the fin structure shown therein.

As shown in FIG. 15, after relaxing the strained semiconductor material 102 within the first fins 108, a stress and/or strain may be induced within the semiconductor material of the first fins 108 (represented in FIG. 15 by cross-hatching). The stress or strain generated within the first fins 108 after the heat treatment process may be opposite in nature to the stress and strain remaining within the remainder of the strained semiconductor material 102 after the heat treatment process. For example, if the remainder of the strained semiconductor material 102 is in a state of tensile stress and strain after the heat treatment, compressive stress and strain may be induced within the first fins 108 (while maintaining the tensile stress and strain within the remainder of the semiconductor material 102). As another example, if the remainder of the strained semiconductor material 102 is in a state of compressive stress and strain after the heat treatment, tensile stress and strain may be induced within the first fins 108 (while maintaining the compressive stress and strain within the remainder of the semiconductor material 102).

As a non-limiting example, the methods previously described with reference to FIGS. 7 through 10 may be used to convert relaxed silicon within the first fins 108 to strained SiGe within the first fins 108.

Figure 16:
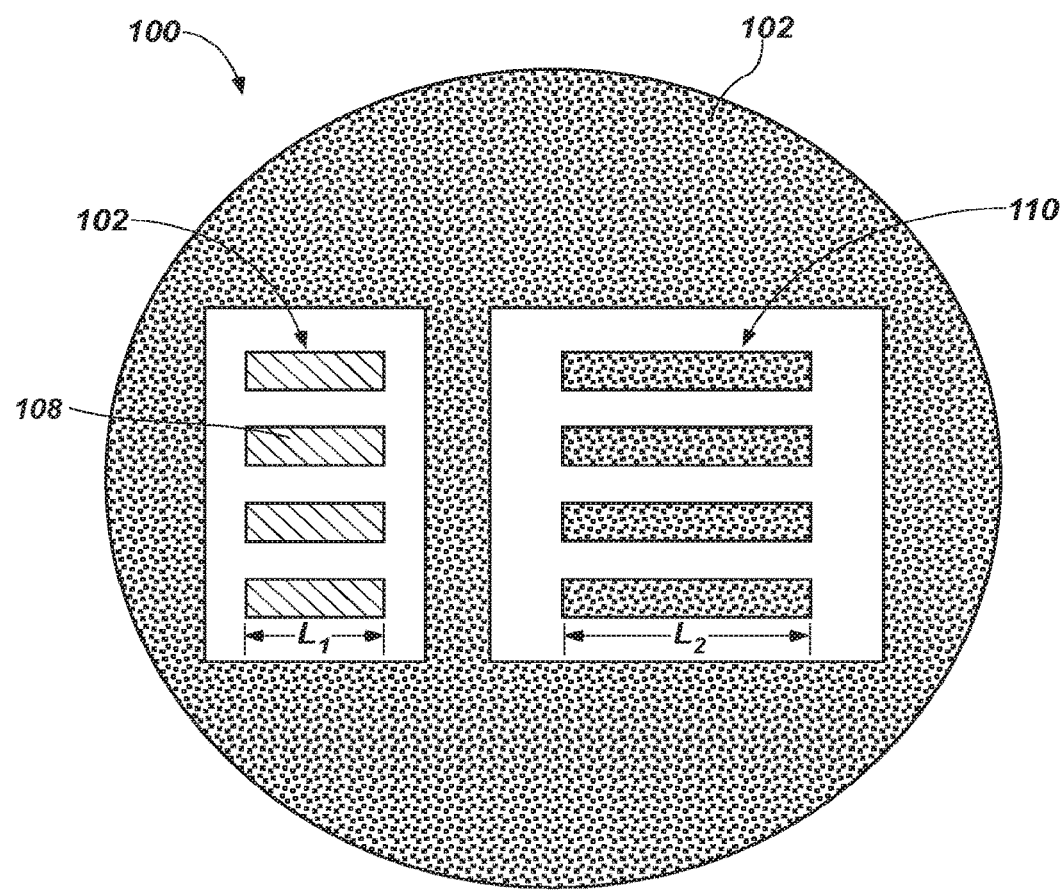
FIG. 16 is a top plan view like that of FIG. 13, but further illustrating the formation of a plurality of second fin structures thereon, such that the structure includes fin structures having different stress/strain states.
Figure 17:
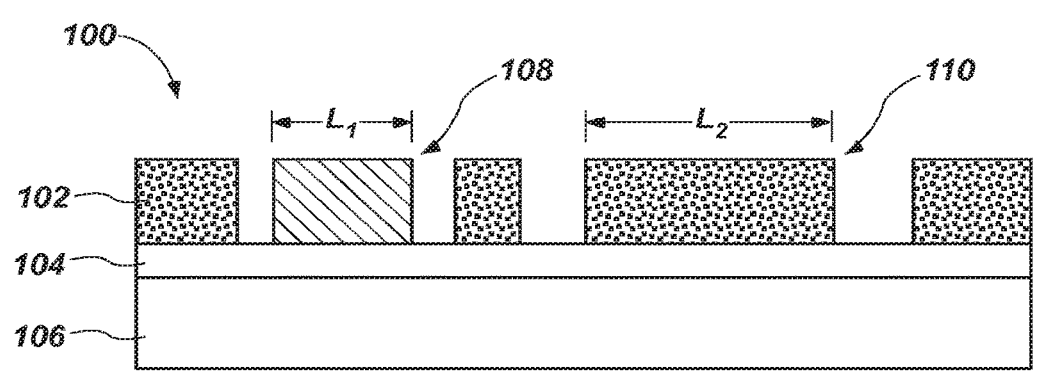
FIG. 17 is a schematically illustrated cross-sectional side view of a portion of the substrate of FIG. 16 and illustrates two fin structures thereof having different stress/strain states.

As shown in FIGS. 16 and 17, the second fins 110 may be formed in the layer of strained semiconductor material 102 after conducting the heat treatment process to relax the first fins 108. The second fins 110 may be formed using a masking and etching process as previously described, and may be formed to have a length $L_2$. As previously mentioned, in embodiments in which the second fins 110 are formed after conducting the heat treatment process as described with reference to FIGS. 11 through 17, the second fins 110 may have lengths $L_2$ that are above, equal to, or below the critical length $L_C$. Furthermore, the second fins 110 optionally may have lengths $L_2$ equal to the lengths $L_1$ of the first fins 108 in such embodiments.

After forming the first fins 108 and the second fins 110 as previously described herein, one of n-type and p-type finFET transistors may be formed using either the first fins 108 or the second fins 110, and the other of n-type and p-type finFET transistors may be formed using the other of the first fins 108 and the second fins 110. For example, n-type finFET transistors may be formed using the first fins 108, and p-type finFET transistors may be formed using the second fins 110. As another example, p-type finFET transistors may be formed using the first fins 108, and n-type finFET transistors may be formed using the second fins 110. In some embodiments, the n-type finFET transistors may be formed using whichever of the first fins 108 and the second fins 110 is in a state of tensile strain, and the p-type finFET transistors may be formed using whichever of the first fins 108 and the second fins 110 is in either a relaxed state or a state of compressive strain. In some embodiments, the p-type finFET transistors may be formed using whichever of the first fins 108 and the second fins 110 is in a state of compressive strain, and the n-type finFET transistors may be formed using whichever of the first fins 108 and the second fins 110 is in either a relaxed state or a state of tensile strain.

Figure 18:
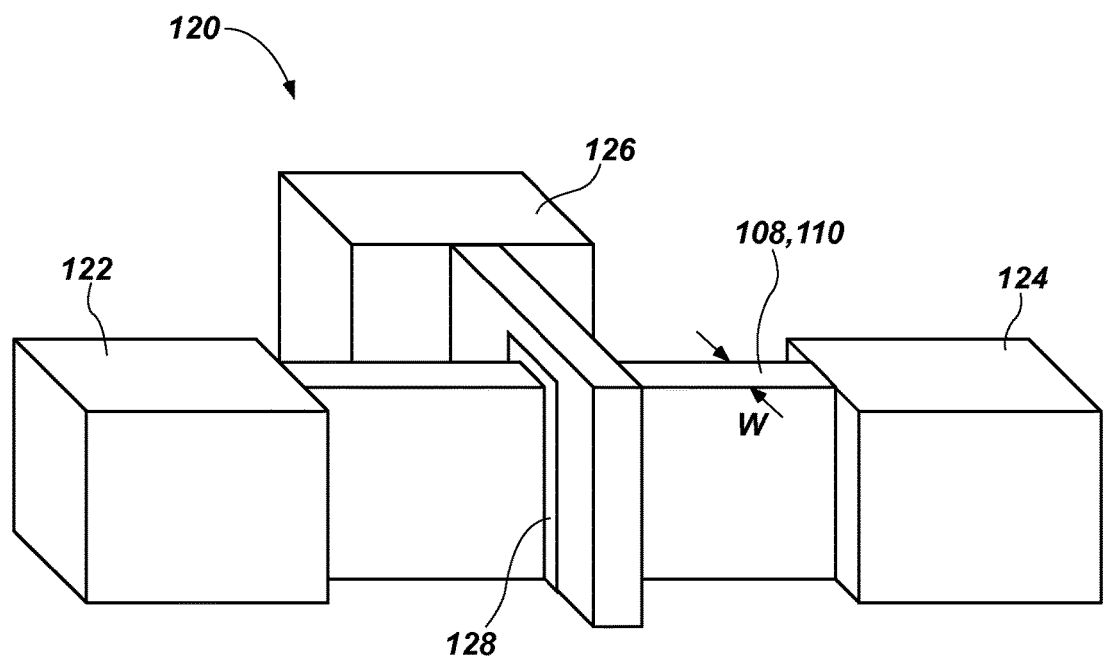
FIG. 18 illustrates an example structure of a finFET transistor.

FIG. 18 illustrates a simplified example embodiment of a finFET structure that may be fabricated using the first fins 108 and/or the second fins 110 in accordance with embodiments of the present disclosure. It should be noted that many different configurations of finFETs are known in the art and may be employed in accordance with embodiments of the disclosure, and the finFET structure shown in FIG. 18 is set forth merely as an example of such finFET structures.

As shown in FIG. 18, a finFET transistor 120 comprises a source region 122, a drain region 124, and a channel extending between the source region 122 and the drain region 124. The channel is defined by and comprises a fin, such as either a first fin 108 or a second fin 110. In some embodiments, the source region 122 and the drain region 124 may include, or be defined by, longitudinal end portions of the fin 108, 110. A conductive gate 126 extends over and adjacent at least a portion of the fin 108, 110 between the source region 122 and the drain region 124. The gate 126 may be separated from the fin 108, 110 by a dielectric material 128. The gate 126 may include a multilayer structure, and may include semiconductive and/or conductive layers. A low-resistance layer including a metal, a metal compound or both, such as a conductive silicide, may be deposited over the source region 122 and/or the drain region 124 to form electrical contacts therewith.

So advantageously, tensile stress in the channel can increase the nFET performance and reduce the threshold voltage, while compressive stress in the channel can increase the pFET performance and reduce the threshold voltage. For some functions, strained devices are beneficial because high performance is needed, and for some other functions, performance is not as important, but a high threshold voltage is beneficial. With this invention, the user can select which device is strained and which is not. For instance, the invention can advantageously be used to incorporate in the same circuit:

Ultra-fast logic parts with tensily strained nFETs and compressively strained pFETs; and SRAM parts with relaxed nFETs and pFETs (lower leakage).

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the invention. Such modifications and embodiments are also intended to fall within the scope of the appended claims.

What is claimed is:

1. A method of fabricating a semiconductor device, comprising:

forming at least one strained first fin in a layer of strained semiconductor material overlying an insulating layer on a base substrate, the at least one strained first fin having a first length below a critical length Lc below which the strained semiconductor material of the at least one strained first fin relaxes upon subsequently conducting a heat treatment between 950° C. and 1250° C.;

after forming the at least one strained first fin, conducting the heat treatment between 950° C. and 1250° C., the heat treatment causing relaxation of stress within the at least one strained first fin so as to form at least one relaxed first fin; and forming at least one strained second fin in the layer of strained semiconductor material;

wherein the at least one strained second fin has a second length above the critical length Lc such that the at least one strained second fin does not relax while conducting the heat treatment between 950° C. and 1250° C., or the at least one strained second fin is formed after conducting the heat treatment.

2. The method of claim 1, wherein the at least one relaxed first fin has a first lattice constant, and the at least one strained second fin has a second lattice constant different from the first lattice constant, and wherein the method further comprises:

forming an n-type field effect transistor comprising one fin selected from the at least one relaxed first fin and the at least one strained second fin, the one fin having the highest lattice constant among the first lattice constant and the second lattice constant; and forming a p-type field effect transistor comprising another fin selected from the at least one relaxed first fin and the at least one strained second fin, the another fin having the lowest lattice constant among the first lattice constant and the second lattice constant.

3. The method of claim 2, wherein the layer of strained semiconductor material is in a state of tensile stress prior to forming the at least one strained first fin in the layer of strained semiconductor material and prior to forming the at least one strained second fin in the layer of strained semiconductor material.

4. The method of claim 3, wherein the layer of strained semiconductor material comprises a tensile strained silicon layer prior to forming the at least one strained first fin in the layer of strained semiconductor material and prior to forming the at least one strained second fin in the layer of strained semiconductor material.

5. The method of claim 4, further comprising forming the at least one strained second fin to have a length of at least 1 μm, and forming the at least one strained first fin to have a length less than 1 μm.

6. The method of claim 4, wherein conducting the heat treatment comprises performing the heat treatment in an inert atmosphere for a time of between 5 minutes and 10 hours.

7. The method of claim 4, further comprising the following actions performed after conducting the heat treatment and prior to forming the p-type field effect transistor comprising the another of the at least one relaxed first fin and the at least one strained second fin:

depositing an epitaxial silicon germanium alloy on the another of the at least one relaxed first fin and the at least one strained second fin;

performing an oxidation condensation process to introduce germanium atoms into the another of the at least one relaxed first fin and the at least one strained second fin and to form a silicon oxide layer over a surface of the another of the at least one relaxed first fin and the at least one strained second fin; and removing the silicon oxide layer.

8. The method of claim 7, further comprising masking the one of the at least one relaxed first fin and the at least one strained second fin before depositing the epitaxial silicon germanium alloy over the another of the at least one relaxed first fin and the at least one strained second fin.

9. The method of claim 1, wherein the layer of strained semiconductor material is in a state of compressive stress prior to forming the at least one strained first fin in the layer of strained semiconductor material and prior to forming the at least one strained second fin in the layer of strained semiconductor material.

10. The method of claim 9, wherein the layer of strained semiconductor material comprises a compressively strained silicon-germanium layer prior to forming the at least one strained first fin in the layer of strained semiconductor material and prior to forming the at least one strained second fin in the layer of strained semiconductor material.

11. The method of claim 10, further comprising forming the at least one strained second fin to have a length of at least 1 μm, and forming the at least one relaxed first fin to have a length less than 1 μm.

12. The method of claim 10, wherein conducting the heat treatment comprises performing the heat treatment in an inert atmosphere for a time of between 10 hours and 1 minute.

13. The method of claim 1, wherein conducting the heat treatment further comprises increasing a density of the insulating layer.

14. The method of claim 13, wherein the at least one relaxed first fin has a first lattice constant after conducting the heat treatment, and the at least one strained second fin has a second lattice constant different from the first lattice constant, the method further comprising:

forming an n-type field effect transistor comprising one fin selected from the at least one relaxed first fin and the at least one strained second fin, the one fin having the highest lattice constant among the first lattice constant and the second lattice constant; and forming a p-type field effect transistor comprising another fin selected from the at least one relaxed first fin and the at least one strained second fin, the another fin having the lowest lattice constant among the first lattice constant and the second lattice constant.

15. The method of claim 14, wherein the layer of strained semiconductor material comprises a tensile strained silicon layer, the method further comprising the following actions performed after conducting the heat treatment and prior to forming the p-type field effect transistor comprising the another of the at least one relaxed first fin and the at least one strained second fin:
depositing an epitaxial silicon germanium alloy on the another of the at least one relaxed first fin and the at least one strained second fin;
performing an oxidation condensation process to introduce germanium atoms into the another of the at least one relaxed first fin and the at least one strained second fin and form a silicon oxide layer over a surface of the another of the at least one relaxed first fin and the at least one strained second fin; and
removing the silicon oxide layer.

16. The method of claim 15, wherein depositing the epitaxial silicon germanium alloy on the another of the at least one relaxed first fin and the at least one strained second fin comprises depositing the epitaxial silicon germanium alloy on the at least one relaxed first fin, and wherein the method further comprises masking the at least one strained second fin before depositing the epitaxial silicon germanium alloy on the at least one relaxed first fin.

17. The method of claim 1, further comprising implanting ions into the insulating layer prior to forming the at least one strained first fin and reducing a viscosity of the insulating layer using the implanted ions.

18. The method of claim 17, wherein the at least one relaxed first fin has a first lattice constant after conducting the heat treatment, and the at least one strained second fin has a second lattice constant different from the first lattice constant, the method further comprising:
forming an n-type field effect transistor comprising one fin selected from the at least one relaxed first fin and the at least one strained second fin, the one fin having the highest lattice constant among the first lattice constant and the second lattice constant; and
forming a p-type field effect transistor comprising another fin selected from the at least one relaxed first fin and the at least one strained second fin, the another fin having the lowest lattice constant among the first lattice constant and the second lattice constant.

19. The method of claim 18, wherein the layer of strained semiconductor material comprises a tensile strained silicon layer, the method further comprising the following actions performed after conducting the heat treatment and prior to forming the p-type field effect transistor comprising the another of the at least one relaxed first fin and the at least one strained second fin:
depositing an epitaxial silicon germanium alloy on the another of the at least one relaxed first fin and the at least one strained second fin;
performing an oxidation condensation process to introduce germanium atoms into the another of the at least one relaxed first fin and the at least one strained second fin and form a silicon oxide layer over a surface of the another of the at least one relaxed first fin and the at least one strained second fin; and
removing the silicon oxide layer.

20. The method of claim 19, further comprising masking the one fin of the at least one relaxed first fin and the at least one strained second fin before depositing the epitaxial silicon germanium alloy on the another fin of the at least one relaxed first fin and the at least one strained second fin.

21. A method of fabricating a semiconductor device, comprising:
forming at least one strained first fin in a layer of strained semiconductor material overlying an insulating layer on a base substrate, the at least one strained first fin having a first length less than 1 μm and below a critical length Lc below which the strained semiconductor material of the at least strained first fin relaxes upon subsequently conducting a heat treatment;
after forming the at least one strained first fin, conducting the heat treatment between 950° C. and 1250° C. in an inert atmosphere for a time of between 5 minutes and 10 hours, the heat treatment causing relaxation of stress within the at least one strained first fin so as to form at least one relaxed first fin; and
forming at least one strained second fin having a second length of at least 1 μm in the layer of strained semiconductor material;
wherein the second length of the at least one strained second fin is above the critical length Lc such that the at least one strained second fin does not relax while conducting the heat treatment between 950° C. and 1250° C., or the at least one strained second fin is formed after conducting the heat treatment.

* * * * *

UNITED STATES PATENT AND TRADEMARK OFFICE
CERTIFICATE OF CORRECTION

PATENT NO. : 9,620,626 B2
APPLICATION NO. : 14/272660
DATED : April 11, 2017
INVENTOR(S) : Frédéric Allibert and Pierre Morin It is certified that error appears in the above-identified patent and that said Letters Patent is hereby corrected as shown below:

In the Specification
Column 8, Line 44, change "used to foal'" to --used to form--

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*